US011877395B2

(12) United States Patent
Onodera et al.

(10) Patent No.: US 11,877,395 B2
(45) Date of Patent: Jan. 16, 2024

(54) THERMOPLASTIC LIQUID CRYSTAL POLYMER FILM AND CIRCUIT BOARD USING SAME

(71) Applicant: KURARAY CO., LTD., Kurashiki (JP)

(72) Inventors: Minoru Onodera, Kurashiki (JP); Tatsuya Sunamoto, Chiyoda-ku (JP); Takeshi Takahashi, Kamisu (JP); Takahiro Nakashima, Kamisu (JP)

(73) Assignee: KURARAY CO., LTD., Kurashiki (JP)

( * ) Notice: Subject to any disclaimer, the term of this patent is extended or adjusted under 35 U.S.C. 154(b) by 0 days.

(21) Appl. No.: 17/245,542

(22) Filed: Apr. 30, 2021

(65) Prior Publication Data

US 2021/0251074 A1 Aug. 12, 2021

Related U.S. Application Data

(63) Continuation of application No. PCT/JP2019/043658, filed on Nov. 7, 2019.

(30) Foreign Application Priority Data

Nov. 8, 2018 (JP) .................................. 2018-210197

(51) Int. Cl.
C09K 19/38 (2006.01)
H05K 1/03 (2006.01)
H05K 1/02 (2006.01)
B32B 15/08 (2006.01)
B32B 7/027 (2019.01)

(52) U.S. Cl.
CPC ........... *H05K 1/0313* (2013.01); *B32B 7/027* (2019.01); *B32B 15/08* (2013.01); *C09K 19/38* (2013.01); *H05K 1/0298* (2013.01); *B32B 2457/08* (2013.01); *H05K 1/024* (2013.01); *H05K 2201/0129* (2013.01); *H05K 2201/0141* (2013.01)

(58) Field of Classification Search
CPC ............... H05K 1/0313; H05K 1/0298; H05K 2201/0129; H05K 2201/0141; H05K 1/024; H05K 1/0326; H05K 3/022; H05K 2201/10098; H05K 2201/10151; H05K 3/46; C09K 19/38; G01S 7/032; G01S 13/931; B32B 7/025; B32B 7/027; B32B 15/08; B32B 27/06; B32B 2457/08; C08J 5/18
See application file for complete search history.

(56) References Cited

U.S. PATENT DOCUMENTS

| 5,529,740 A | 6/1996 | Jester et al. | |
| 5,690,859 A * | 11/1997 | Takayanagi | C09K 19/3809 252/299.66 |
| 5,703,202 A | 12/1997 | Jester et al. | |
| 6,274,242 B1 | 8/2001 | Onodera et al. | |
| 7,740,790 B2 | 6/2010 | Onodera et al. | |
| 9,538,646 B2 | 1/2017 | Onodera et al. | |
| 10,765,001 B2 | 9/2020 | Nakashima et al. | |
| 2005/0067739 A1 | 3/2005 | Onodera et al. | |
| 2006/0257622 A1* | 11/2006 | Shin | B32B 27/02 428/137 |
| 2008/0107833 A1* | 5/2008 | Onodera | B29C 66/91933 156/324 |
| 2008/0217050 A1* | 9/2008 | Egitto | H05K 3/462 174/262 |
| 2013/0306358 A1* | 11/2013 | Ohmori | B29C 43/18 156/60 |
| 2014/0231123 A1* | 8/2014 | Onodera | C08J 5/18 174/255 |
| 2015/0017413 A1* | 1/2015 | Konno | B29C 55/12 264/234 |
| 2015/0195921 A1* | 7/2015 | Onodera | C09K 19/3087 174/258 |
| 2016/0212845 A1* | 7/2016 | Nakashima | H05K 1/0326 |
| 2016/0236402 A1* | 8/2016 | Nakashima | C08J 5/121 |
| 2018/0057943 A1* | 3/2018 | Tsukamoto | H05K 3/181 |

(Continued)

FOREIGN PATENT DOCUMENTS

| CN | 1232860 A | 10/1999 |
| CN | 1616526 A | 5/2005 |
| CN | 1820942 A | 8/2006 |

(Continued)

OTHER PUBLICATIONS

Definition of "Thickness", dictionary.cambridge.org (Year: 2023).*
International Preliminary Report on Patentability and Written Opinion of the International Searching Authority dated May 20, 2021 in PCT/JP2019/043658 (submitting English translation only), 7 pages.
International Search Report dated Feb. 10, 2020 in PCT/JP2019/043658 filed on Nov. 7, 2019, 3 pages.
Japanese Office Action dated Jul. 21, 2020 in Japanese Patent Application No. 2020-515270, 5 pages (with English Machine Translation).

(Continued)

*Primary Examiner* — Steven T Sawyer
(74) *Attorney, Agent, or Firm* — Oblon, McClelland, Maier & Neustadt, L.L.P.

(57) ABSTRACT

Provided is a thermoplastic liquid crystal polymer film (TLCP film) having a dielectric constant in a thickness direction of the film, which is suitable for a millimeter-wave radar substrate. The TLCP film is a film comprising a thermoplastic polymer capable of forming an optically anisotropic melt phase, wherein the TLCP film has a dielectric constant of from 2.5 to 3.2 in the thickness direction of the film at a temperature of 23° C. and a frequency of 20 GHz, and a heat deformation temperature of from 180 to 320° C. The TLCP film has, on a film plane, dielectric constants of from 2.6 to 3.7 at a temperature of 23° C. and a frequency of 15 GHz both in one direction of the film and in a direction perpendicular to the one direction of the film.

16 Claims, No Drawings

(56) References Cited

U.S. PATENT DOCUMENTS

| | | | | |
|---|---|---|---|---|
| 2018/0139848 | A1* | 5/2018 | Tateoka | ............... B32B 27/322 |
| 2021/0008839 | A1* | 1/2021 | Zhang | .................... B32B 27/20 |

FOREIGN PATENT DOCUMENTS

| CN | 103069933 | A | 4/2013 |
|---|---|---|---|
| CN | 103402757 | A | 11/2013 |
| CN | 103917582 | A | 7/2014 |
| CN | 104220236 | A | 12/2014 |
| JP | 08-090570 | A | 4/1996 |
| JP | 2001-081215 | A | 3/2001 |
| JP | 2001-088219 | A | 4/2001 |
| JP | 2005-103989 | A | 4/2005 |
| JP | 2005-105165 | A | 4/2005 |
| JP | 2010-000795 | A | 1/2010 |
| JP | 2010-229200 | A | 10/2010 |
| JP | 2012-077117 | A | 4/2012 |
| JP | 2018-109090 | A | 7/2018 |
| JP | 2018-174287 | A | 11/2018 |
| JP | 2020-72198 | A | 5/2020 |
| WO | WO 2013/065453 | A1 | 5/2013 |
| WO | WO 2013/146174 | A1 | 10/2013 |
| WO | WO 2015/050080 | A1 | 4/2015 |

OTHER PUBLICATIONS

Combined Chinese Office Action and Search Report dated Nov. 1, 2021 in Patent Application No. 201980072752.X (with English machine translation), 14 pages.
Combined Chinese Office Action and Search Report dated Apr. 26, 2022 in Patent Application No. 201980072752.X (with English machine translation and English translation of Category of Cited Documents), 31 pages.
Vecstar Kuraray LCP Film, Jun. 2012, 4 pages.
Minoru Onodera, et al., "Improvement of dielectric property of liquid crystal polymer films as circuit material," $26^{th}$ Meeting in Spring of The Japan Institute of Electronics Packaging, 8A-02, Mar. 8, 2012, pp. 51-52.
"Summary of $26^{th}$ Meeting of Journal of The Japan Institute of Electronics Packaging," Journal of The Japan Institute of Electronics Packaging, vol. 15, No. 3. 2012, pp. 208-217.
Minoru Onodera, "Flexible Printed Circuit-Liquid Crystal Polymer," Journal of The Japan Institute of Electronics Packaging, vol. 8, No. 2, 2005, pp. 90-94.
Tatsuya Sunamoto, et al, "Dielectric Characteristic and Application of the Liquid Crystal Polymer Film Improved the Anisotropy of Complex Dielectric Constant (Complex Permittivity)," Journal of The Japan Institute of Electronics Packaging, vol. 18, No. 5, 2015, pp. 316-318.
Shinichi Nagata, et al., "Measurement of the Crystallinity for PET Films by Complex Dielectric Constant Method," Seikei-Kakou, vol. 9, No. 11, 1997, pp. 897-903 (with English Abstract).
Michinori Oki, et al., "Encyclopedic Dictionary ofChemistry," Tokyo Kagaku Dojin, Oct. 20, 1989, 4 pages.
Sunao Fukutake, et al., "Liquid crystal polymer as high functional material," New development of Liquid Crystal Polymers, Jul. 30, 2004, 22 pages.
Tatsuya Sunamoto, "Improvement in high frequency characteristics of high frequency liquid crystal polymer film and its application in circuit board," Material Stage, vol. 18, No. 4, 2018, 7 pages.

* cited by examiner

THERMOPLASTIC LIQUID CRYSTAL POLYMER FILM AND CIRCUIT BOARD USING SAME

CROSS REFERENCE TO THE RELATED APPLICATION

This application is a continuation application, under 35 U.S.C. § 111(a), of international application No. PCT/JP2019/043658 filed Nov. 7, 2019, which claims Convention priority to Japanese patent application No. 2018-210197, filed Nov. 8, 2018, the entire disclosures of all of which are herein incorporated by reference as a part of this application.

BACKGROUND OF THE INVENTION

The present invention relates to a film comprising a thermoplastic polymer capable of forming an optically anisotropic melt phase (hereinafter, referred to as thermoplastic liquid crystal polymer film or TLCP film) and to a TLCP film usable as a circuit board in ranges of high frequencies (for example, from 1 to 300 GHz), in particular, at microwave or millimeter-wave frequencies (for example, from 10 to 300 GHz, and preferably from 30 to 300 GHz).

In order to achieve safe driving assistance and autonomous driving of vehicles, infrared radars and millimeter-wave radars have been developed, which are configured to be mounted on vehicle bodies to detect inter-vehicle distances and the like. Among such radars, the millimeter-wave radars have been drawing much attention in that they have stable detection capability even under bad weather conditions such as rain and fog. Such a millimeter-wave radar includes an antenna for transmitting and receiving electromagnetic signals, and the antenna is constituted by a conductor layer (such as copper foil) precisely disposed on an insulation substrate.

Known insulation substrates for antennas include ceramic substrates and substrates of fluorine-containing resin. The ceramic substrates, however, have a problem in that they are difficult to process because of its high rigidity and are expensive. The fluorine-containing resin substrates also have a problem in that they are soft so that addition of glass cloth, fillers, and others used to enhance dimensional stability disadvantageously affects high-frequency characteristics as well as moisture resistance of the whole substrate.

In contrast, TLCP films have been receiving increasing attention as having excellent processability and favorable high-frequency characteristics. Patent Document 1 (JP Laid-open Patent Publication No. 2012-077117) describes a TLCP film envisaged for use in millimeter-wave radars.

Patent Document 1 discloses a TLCP film having a thermal expansion coefficient of from 0 to 25 ppm/° C. and a dielectric constant within a predetermined range of variation coefficient determined on its surface.

RELATED DOCUMENT

Patent Document

[Patent Document 1] JP Laid-open Patent Publication No. 2012-077117

SUMMARY OF THE INVENTION

Patent Document 1 describes a TLCP film having a highly controlled in-plane dielectric constant, i.e., a dielectric constant in a so-called planar direction. The document is, however, silent on a dielectric constant in a thickness direction of a material which is essentially used for high-frequency circuits and/or millimeter-wave radar circuits.

For example, it is known that such a millimeter-wave radar has a circuit with a stripline structure on its substrate, in which not only a dielectric constant in a planar direction of a substrate material, but also a dielectric constant in a thickness direction of the material is an important parameter.

However, it has been difficult to control dielectric constant of a TLCP film in the thickness direction, probably because, in the TLCP film with a high melt fluidity, molecules constituting the film flow and move easily. In addition, in order to improve processability of the TLCP films in multilayer laminates, it is desirable for the TLCP films to have lower heat deformation temperatures.

Therefore, an object of the present invention is to provide a TLCP film having excellent processability and a controlled dielectric constant in a thickness direction of the film, which affects antenna characteristics.

Another object of the present invention is to also provide a TLCP film having a controlled thermal expansion coefficient in a planar direction, which affects warp deformation and/or dimensional stability of the film.

Yet another object of the present invention is to provide a TLCP film suitably used for producing a microwave or millimeter-wave antenna.

Based on the result of intensive studies to achieve the above objects, the inventors have investigated that (1) contrary to the fact that TLCP films have been conventionally considered to have drawbacks in that too easy molecular movements are caused at a temperature upon multilayer lamination due to high melt fluidity of the films, (2) there is a possibility to rather take advantage of the fluidity of the highly fluid molecules. The inventors have further investigated and found that (3) where the films are heated and controlled such that the liquid crystal polymer molecules on film surfaces are exposed to a shearing force by a specific process, (4) surprisingly, it is possible to control dielectric constants in thickness directions of the TLCP films while maintaining processability of the films. The inventors thus achieved the present invention.

That is, the present invention may include the following aspects.

Aspect 1

A TLCP film comprising a thermoplastic polymer capable of forming an optically anisotropic melt phase (hereinafter, referred to as thermoplastic liquid crystal polymer or TLCP), wherein the TLCP film has a dielectric constant of from 2.5 to 3.2 (preferably from 2.6 to 3.2, and more preferably from 2.7 to 3.1) in a thickness direction of the film at a temperature of 23° C. and a frequency of 20 GHz, and a heat deformation temperature of from 180 to 320° C. (preferably from 200 to 310° C., and more preferably from 220 to 30° C.).

Aspect 2

The TLCP film according to aspect 1, wherein the TLCP film has, on a film plane, thermal expansion coefficients of from 13 to 22 ppm/° C. (preferably from about 15 to 20 ppm/° C., and more preferably from about 16 to 19 ppm/° C.) both in one direction of the film and in a direction perpendicular to the one direction of the film.

Aspect 3

The TLCP film according to aspect 1 or 2, wherein the TLCP film has, on a film plane, dielectric constants of from 2.6 to 3.7 (preferably from 2.7 to 3.7, more preferably from 2.9 to 3.6, and further preferably from 3.1 to 3.5) at a temperature of 23° C. and a frequency of 15 GHz both in one direction of the film and in a direction perpendicular to the one direction of the film.

Aspect 4

The TLCP film according to any one of aspects 1 to 3, wherein the TLCP film has dielectric constants at a temperature of 23° C. and a frequency of GHz in a relationship represented by the following formula. (1):

$$0 \leq |(D_X+D_Y)/2 - D_Z| \leq 0.9 \quad (1)$$

wherein $D_X$ denotes a dielectric constant in, among planar directions of the film, one direction of the film on a film plane, $D_Y$ denotes a dielectric constant in a direction perpendicular to the one direction of the film on the film plane, and $D_Z$ denotes a dielectric constant in the thickness direction of the film.

Aspect 5

The TLCP film according to any one of aspects 1 to 4, wherein a ratio ($D_X/D_Y$) of a dielectric constant ($D_X$) in one direction of the film to a dielectric constant ($D_Y$) in a direction perpendicular to the one direction of the film at a temperature of 23° C. and a frequency of 15 GHz on a film plane falls within a range of from 0.73 to 1.37 (preferably from 0.81 to 1.24, and further preferably from 0.89 to 1.13).

Aspect 6

The TLCP film according to any one of aspects 1 to 5, wherein a ratio ($\alpha_X/\alpha_Y$) of a thermal expansion coefficient ($\alpha_X$) in one direction of the film to a thermal expansion coefficient ($\alpha_Y$) in a direction perpendicular to the one direction of the film on a film plane falls within a range of from 0.6 to 1.7 (preferably from 0.8 to 1.3).

Aspect 7

The TLCP film according to any one of aspects 1 to 6, wherein the TLCP film is used as a substrate material in a radar adapted to a frequency band of from 1 to 300 GHz (preferably from 10 to 300 GHz, and more preferably from to 300 GHz).

Aspect 8

A metal-clad laminate comprising the TLCP film as recited in any one of aspects 1 to 7 and a metal layer provided on at least one surface of the TLCP film.

Aspect 9

A circuit board comprising at least one conductor layer and the TLCP film as recited in any one of aspects 1 to 7.

Aspect 10

The circuit board according to aspect 9, wherein the circuit board is a multilayer circuit board.

Aspect 11

The circuit board according to aspect 9 or 10, comprising a semiconductor element.

Aspect 12

A vehicular radar comprising the circuit board as recited in any one of aspects 9 to 11.

Any combination of at least two constructions, disclosed in the appended claims and/or the specification should be construed as included within the scope of the present invention. In particular, any combination of two or more of the appended claims should be equally construed as included within the scope of the present invention.

Effects of the Invention

The present invention can provide a TLCP film having uniformity due to its dielectric constant in a thickness direction within a predetermined range as well as excellent processability due to its heat deformation temperature within a predetermined range.

The TLCP film of the present invention can be suitably used as a member constituting a high-frequency circuit and/or a vehicular radar (for example, as a millimeter-wave antenna substrate).

DESCRIPTION OF THE EMBODIMENTS

Thermoplastic Liquid Crystal Polymer

A thermoplastic liquid crystal polymer is formed from a melt-processable liquid crystalline polymer (or a polymer capable of forming an optically anisotropic melt phase). Chemical formulation of the thermoplastic liquid crystal polymer is not particularly limited to a specific one as long as it is a melt-processable liquid crystalline polymer, and examples thereof may include a thermoplastic liquid crystal polyester, or a thermoplastic liquid crystal polyester amide having an amide bond introduced thereto.

The thermoplastic liquid crystal polymer may also be a polymer obtained by further introducing, to an aromatic polyester or an aromatic polyester amide, an imide bond, a carbonate bond, a carbodiimide bond, or an isocyanate-derived bond such as an isocyanurate bond.

Specific examples of the thermoplastic liquid crystal polymer used in the present invention may include known thermoplastic liquid crystal polyesters and thermoplastic liquid crystal polyester amides obtained from compounds classified as (1) to (4) as exemplified in the following, and derivatives thereof. However, it is needless to say that, in order to form a polymer capable of forming an optically anisotropic melt phase, there is a suitable range regarding the combination of various raw-material compounds.

(1) Aromatic or aliphatic diols (see Table 1 for representative examples)

TABLE 1

Chemical structural formulae of representative examples of aromatic or aliphatic diols

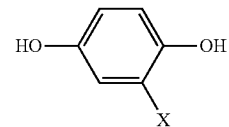

X represents a hydrogen atom or a halogen atom, or a group such as a lower alkyl (e.g., $C_{1-3}$ alkyl) or a phenyl

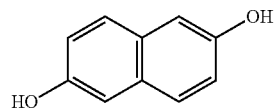

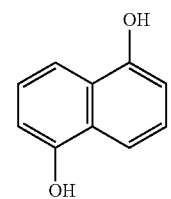 [SMILES: Oc1cccc2c(O)cccc12]

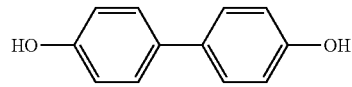 [SMILES: Oc1ccc(-c2ccc(O)cc2)cc1]

TABLE 1-continued

Chemical structural formulae of representative examples of aromatic or aliphatic diols

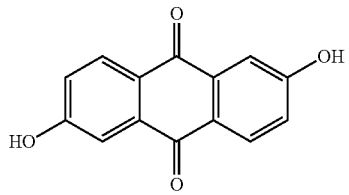 [SMILES: O=C1c2ccc(O)cc2C(=O)c2ccc(O)cc21]

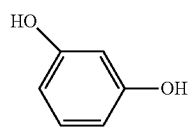

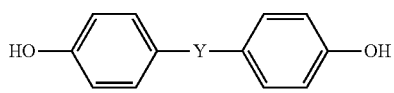

Y represents a group such
as —O—, —CH$_2$—, —S—, —CO—, —C(CH$_3$)$_2$—,
or —SO$_2$—
HO(CH$_2$)$_n$OH n is an integer of 2 to 12

(2) Aromatic or aliphatic dicarboxylic acids (see Table 2 for representative examples)

TABLE 2

Chemical structural formulae of representative examples of aromatic or aliphatic dicarboxylic acids

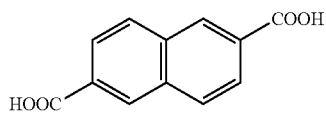 [SMILES: O=C(O)c1ccc2cc(C(=O)O)ccc2c1]

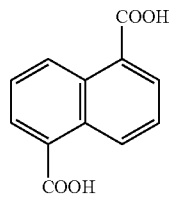 [SMILES: O=C(O)c1cccc2c(C(=O)O)cccc12]

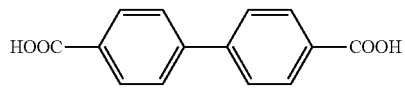 [SMILES: O=C(O)c1ccc(-c2ccc(C(=O)O)cc2)cc1]

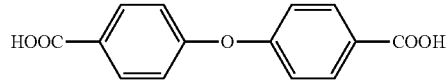

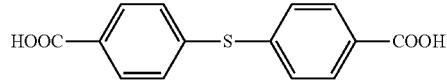 [SMILES: O=C(O)c1ccc(Oc2ccc(C(=O)O)cc2)cc1]

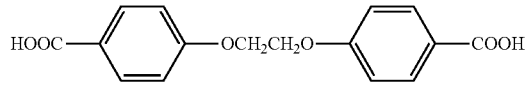

TABLE 2-continued

Chemical structural formulae of representative examples of aromatic or aliphatic dicarboxylic acids

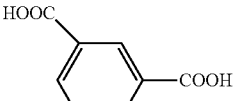

HOOC(CH$_2$)$_n$COOH n is an integer of 2 to 12

(3) Aromatic hydroxycarboxylic acids (see Table 3 for representative examples)

TABLE 3

Chemical structural formulae of representative examples of aromatic hydroxycarboxylic acids

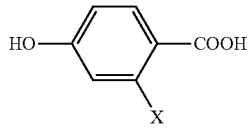

X represents a hydrogen atom or a halogen atom, or a group such as a lower alkyl (e.g., C$_{1-3}$ alkyl) or a phenyl

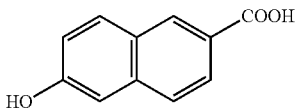 [SMILES: O=C(O)c1ccc2cc(O)ccc2c1]

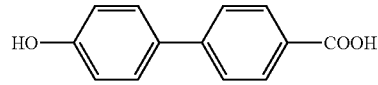

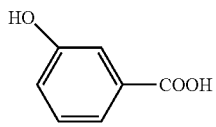

(4) Aromatic diamines, aromatic hydroxy amines, and aromatic aminocarboxylic acids (see Table 4 for representative examples)

TABLE 4

Chemical structural formulae of representative examples of aromatic diamines, aromatic hydroxy amines, or aromatic aminocarboxylic acids

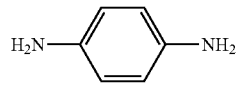

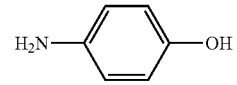

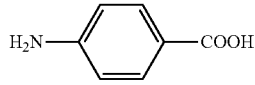

Representative examples of thermoplastic liquid crystal polymers obtained from these raw-material compounds may include copolymers having structural units shown in Tables 5 and 6.

TABLE 5
Representative examples (1) of thermoplastic liquid crystal polymer
(A) 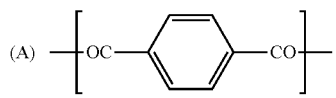
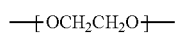
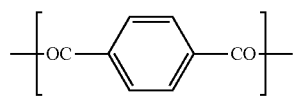
(B) 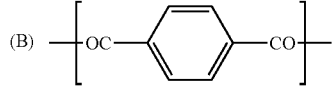
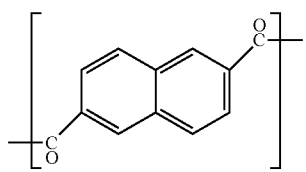
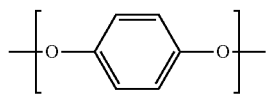
(C) 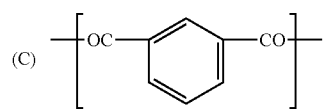
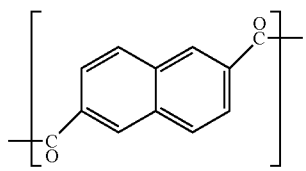
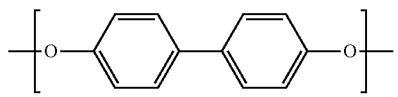
(D) 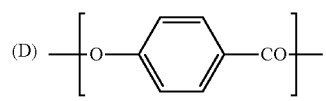
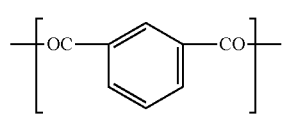
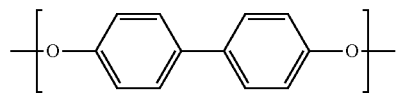
(E) 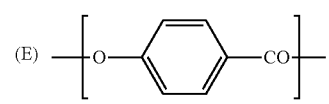
TABLE 5-continued
Representative examples (1) of thermoplastic liquid crystal polymer
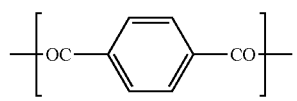
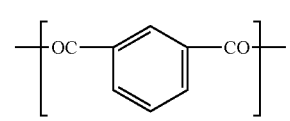
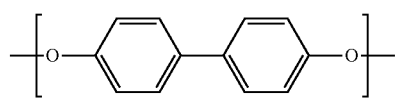
(F) 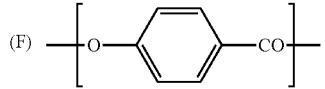
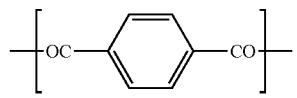
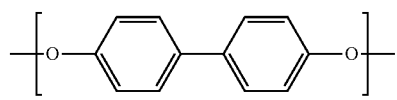
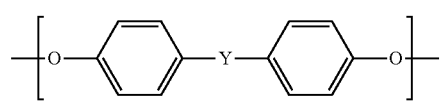
Y is a group such as —O—, —S—, or —CH$_2$—
(G) 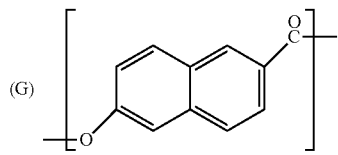
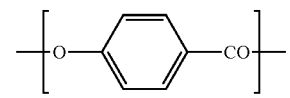
(H) 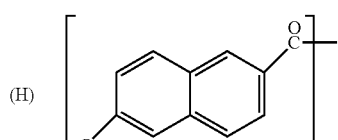
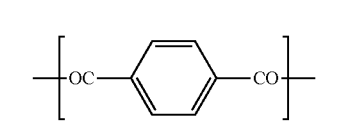
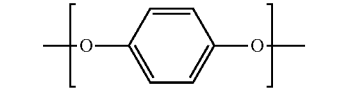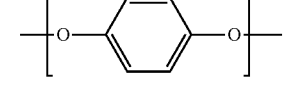

TABLE 5-continued
Representative examples (1) of thermoplastic liquid crystal polymer
(I) 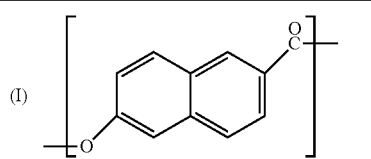
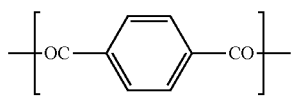
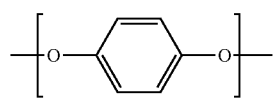
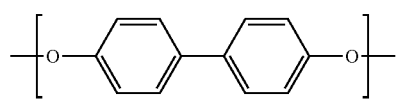
(J) 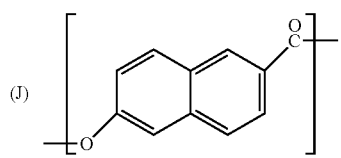
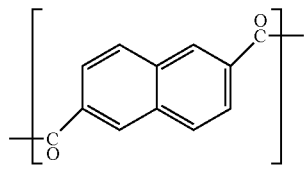
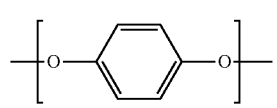
TABLE 6
Representative examples (2) of thermoplastic liquid crystal polymer
(K) 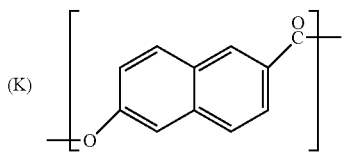
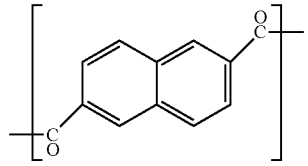
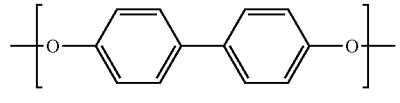
TABLE 6-continued
Representative examples (2) of thermoplastic liquid crystal polymer
(L) 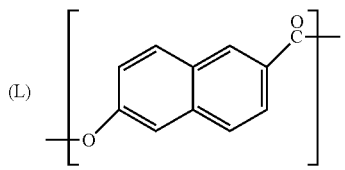
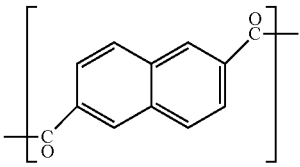
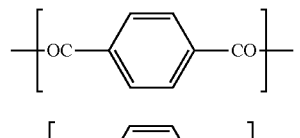
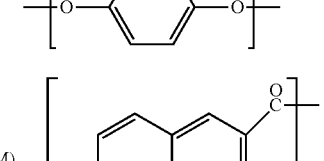
(M) 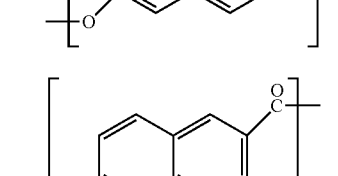
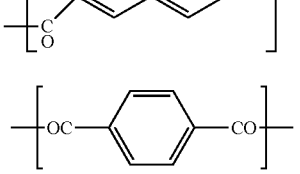
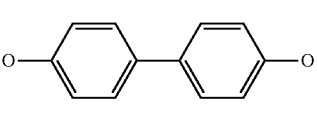
(N) 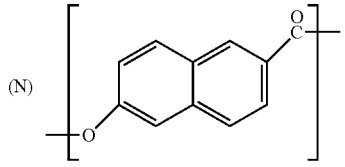
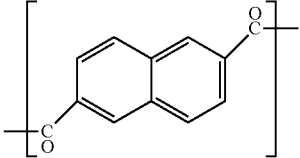
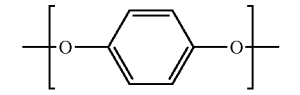

TABLE 6-continued

Representative examples (2) of thermoplastic liquid crystal polymer

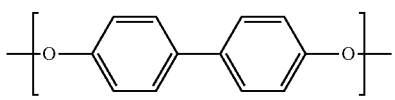

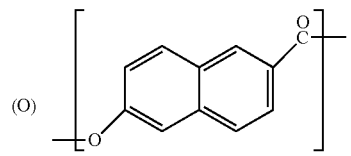

(O)

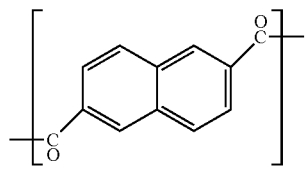

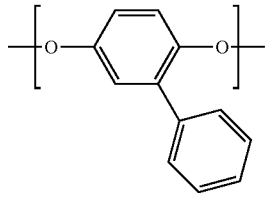

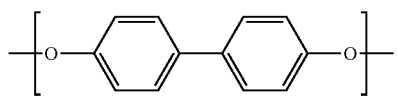

(P)

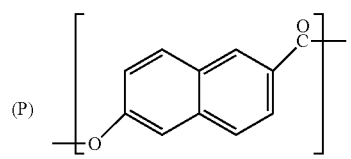

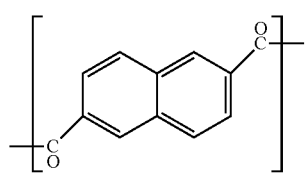

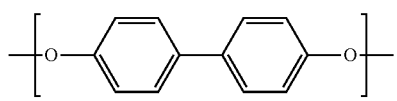

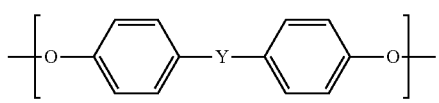

Y is a group such as —O—, —S—, or —CH$_2$—

(Q)

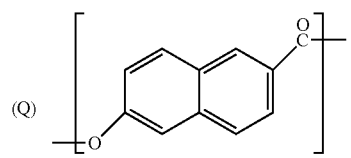

TABLE 6-continued

Representative examples (2) of thermoplastic liquid crystal polymer

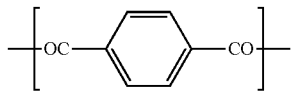

Of these copolymers, preferable polymers include at least p-hydroxybenzoic acid and/or 6-hydroxy-2-naphthoic acid as repeating units, and particularly preferred polymers include:
  a polymer (i) having repeating units of p-hydroxybenzoic acid and 6-hydroxy-2-naphthoic acid; and
  a copolymer (ii) having repeating units of
    at least one aromatic hydroxycarboxylic acid selected from a group consisting of p-hydroxybenzoic acid and 6-hydroxy-2-naphthoic acid,
    at least one aromatic diol, and
    at least one aromatic dicarboxylic acid.

For example, in the case where the polymer (i) comprises a thermoplastic liquid crystal polymer having repeating units of at least p-hydroxybenzoic acid (A) and 6-hydroxy-2-naphthoic acid (B), the thermoplastic liquid crystal polymer may have a mole ratio (A)/(B) of preferably about (A)/(B)=10/90 to 90/10, more preferably about (A)/(B)=15/85 to 85/15, and further preferably about (A)/(B)=20/80 to 80/20.

Furthermore, in the case where the polymer (ii) comprises a thermoplastic liquid crystal polymer having repeating units of: at least one aromatic hydroxycarboxylic acid (C) selected from a group consisting of p-hydroxybenzoic acid and 6-hydroxy-2-naphthoic acid; at least one aromatic diol (D) selected from a group consisting of 4,4'-dihydroxybiphenyl, hydroquinone, phenylhydroquinone, and 4,4'-dihydroxydiphenyl ether; and at least one aromatic dicarboxylic acid (E) selected from a group consisting of terephthalic acid, isophthalic acid, and 2,6-naphthalene dicarboxylic acid, the thermoplastic liquid crystal polymer may have a mole ratio of about aromatic hydroxycarboxylic acid (C):aromatic diol (D):aromatic dicarboxylic acid (E)=30 to 80:35 to 10:35 to 10, more preferably about (C):(D):(E)=35 to 75:32.5 to 12.5:32.5 to 12.5, and further preferably about (C):(D): (E)=40 to 70:30 to 15:30 to 15.

Furthermore, the liquid crystal polymer may have a mole ratio of a repeating structural unit derived from 6-hydroxy-2-naphthoic acid to the aromatic hydroxycarboxylic acids (C), for example, of 85 mol % or higher, preferably 90 mol % or higher, and more preferably 95 mol % or higher. The liquid crystal polymer may have a mole ratio of a repeating structural unit derived from 2,6-naphthalene dicarboxylic acid to the aromatic dicarboxylic acids (E), for example, of 85 mol % or higher, preferably 90 mol % or higher, and more preferably 95 mol % or higher.

The aromatic diol (D) may include repeating structural units (D1) and (D2) derived from two different aromatic diols each selected from a group consisting of hydroquinone, 4,4'-dihydroxybiphenyl, phenylhydroquinone, and 4,4'-dihydroxydiphenyl ether. In such a case, the two aromatic diols may have a mole ratio (D1)/(D2)=23/77 to 77/23, more preferably 25/75 to 75/25, and further preferably 30/70 to 70/30.

Furthermore, the liquid crystal polymer may have a mole ratio of a repeating structural unit derived from an aromatic diol to a repeating structural unit derived from an aromatic dicarboxylic acid of preferably (D)/(E)=95/100 to 100/95. Deviation from this range may tend to result in a low degree of polymerization and deterioration in mechanical strength.

It should be noted that, in the present invention, optical anisotropy in a molten state can be determined by, for example, placing a sample on a hot stage, heating the sample at an elevating temperature under nitrogen atmosphere, and observing light transmitted through the sample.

A preferred thermoplastic liquid crystal polymer has a melting point (hereinafter, referred to as $Tm_0$) in a range of, for example, from 200° C. to 360° C., preferably from 240° C. to 350° C., and more preferably from 260° C. to 330° C. The melting point may be determined by observing thermal behavior of a polymer sample using a differential scanning calorimeter. That is, a melting point of a thermoplastic liquid crystal polymer sample may be determined by subjecting the sample to temperature elevation at a rate of 10° C./min to completely melt the sample, then to rapid cooling the molten polymer at a rate of 10° C./min to 50° C., and again to temperature elevation at a rate of 10° C./min to determine the position of an endothermic peak that occurs during the second temperature elevation as the melting point of the polymer sample.

In terms of melt processibility, the thermoplastic liquid crystal polymer may have a melt viscosity of, for example, from 30 to 120 Pa·s (preferably from 50 to 100 Pa·s) at a temperature of $(Tm_0+20)°$ C. at a shear rate of 1000/s.

As long as the advantageous effect of the present invention is not deteriorated, to the thermoplastic liquid crystal polymer, may be added any thermoplastic polymer such as a polyethylene terephthalate, a modified polyethylene terephthalate, a polyolefin, a polycarbonate, a polyarylate, a polyamide, a polyphenylene sulfide, a polyether ether ketone, and a fluorine-containing resin; and/or various additives. If necessary, a filler may be added to the thermoplastic liquid crystal polymer.

Method of Producing TLCP Film

In the present invention, a TLCP film is subjected to three-dimensional structure control under specific conditions in order to control a dielectric constant in a thickness direction of the film while maintaining processibility (moldability) of the film.

A method of producing a TLCP film according to the present invention (a TLCP film with a controlled dielectric constant in a thickness direction) may preferably at least include: heat-treating a laminated material including a TLCP film (a TLCP film with an uncontrolled dielectric constant in a thickness direction) and a pair of heat-resistant releasable supports disposed on opposite surfaces of the TLCP film, i.e., the TLCP film is sandwiched with the pair of heat-resistant releasable supports, under a predetermined pressure at a temperature of from (HT+10) to (HT+60)° C. relative to a heat deformation temperature (wherein and hereinafter, sometimes referred to as HT) of the non-heat-treated TLCP film; and peeling the pair of heat-resistant releasable supports from the laminated material to obtain the heat-treated TLCP film, Heat Treatment Step In the heat treatment step, an extruded TLCP film (for example, by an inflation method) is prepared, and heat treatment is performed to a laminated material including the TLCP film and a pair of heat-resistant releasable supports disposed on opposite surfaces of the TLCP film, under a predetermined pressure at a specific temperature. Presumably because liquid crystal polymer molecules existing in the opposed surfaces (front and back surfaces) as skin layers are exposed to a shearing force during the heat treatment, the heat-treated TLCP film can have a controlled dielectric constant in a thickness direction of the film within a desired range.

As long as the objects of the present invention can be achieved, the heat-resistant releasable supports disposed on the opposite surfaces of the TLCP film may be of a same type or different types, and it is preferable to use heat-resistant releasable supports of a same type.

The species of the heat-resistant releasable supports are not particularly limited as long as the dielectric constant in the thickness direction of the TLCP film can be controlled within a predetermined range. The heat-resistant releasable supports may be, for example, heat-resistant releasable films (e.g., polyimide films) so as to render the surfaces of the TLCP film to be susceptible against a shearing force on the TLCP film during the heat treatment.

As the heat-resistant releasable supports (for example, heat-resistant releasable films), there may be mentioned a heat-resistant releasable support, that is applicable as a supporting body for the heat treatment, and has, on a plane direction, thermal expansion coefficients within the predetermined range (for example, from 10 to 27 ppm/° C., preferably from 10 to 22 ppm/° C., and more preferably from 15 to 22 ppm/° C.) in one direction of the heat-resistant releasable support as well as in a direction perpendicular to the one direction.

Preferably, on the plane of the heat-resistant releasable support (for example, heat-resistant releasable film), a ratio $(\alpha_{0X}/\alpha_{0Y})$ of a thermal expansion coefficient $(\alpha_{0X})$ in one direction (X direction) of the heat-resistant releasable support to a thermal expansion coefficient $(\alpha_{0Y})$ in a direction (Y direction) perpendicular to the one direction may fall within a range of, for example, from 0.6 to 1.7, preferably from 0.8 to 1.2, and more preferably from 0.9 to 1.1.

Where a heat-resistant releasable support has different thermal expansion coefficients between in one direction of the heat-resistant releasable support and in a direction perpendicular to the one direction, a pair of such heat-resistant releasable supports may be disposed on the opposite surfaces of the TLCP film, respectively, such that the directions of larger thermal expansion coefficients of the heat-resistant releasable supports are aligned with a larger thermal expansion coefficient of the TLCP film. Alternatively, a pair of such heat-resistant releasable supports may be disposed on the opposite surfaces of the TLCP film, respectively, such that the directions of larger thermal expansion coefficients are not aligned with each other. From the viewpoint of controlling the thermal expansion coefficients in planar directions of the TLCP film, the heat-resistant releasable supports are preferably disposed on the opposite surfaces of the TLCP film, respectively, such that the directions of the larger thermal expansion coefficients of the heat-resistant releasable supports are aligned with that of the TLCP film.

In the heat treatment step, the heat-resistant releasable supports (for example, heat-resistant releasable films) are thermally compression-bonded to the opposite surfaces of the TLCP film, respectively, to form a laminated material, and the heat treatment is performed to the laminated material under a specific pressure.

The pressure is applied to the laminated material in which the opposite surfaces of the TLCP film being in close contact with the respective heat-resistant releasable supports (for example, heat-resistant releasable films). In order to apply a sufficient shearing force to the TLCP film, the pressure may be, for example, in a range of from 1 to 6 MPa, preferably from 1.5 to 4.5 MPa, and more preferably from 2 to 3 MPa.

In order to control the dielectric constant in the thickness direction, the heat treatment may be performed at a heat treatment temperature of, for example, from (HT+10) to (HT+60)° C., and preferably from (HT+20) to (HT+55)° C. relative to a heat deformation temperature (HT) of a non-heat-treated TLCP film. Where the heat treatment temperature is too low, it is not possible to change the dielectric constant in the thickness direction. Where the heat treatment temperature is too high, it is difficult to control the dielectric constant in the thickness direction, presumably because fluidity of the liquid crystal polymer molecules in the skin layers is too high.

The non-heat-treated TLCP film (TLCP film before subjecting to the heat treatment step) may have a heat deformation temperature (HT) of from 180 to 320° C., preferably from 200 to 310° C., and more preferably from 220 to 300° C. It should be noted that the heat deformation temperature is a value measured in accordance with the method described in the below-mentioned Examples.

In the heat treatment step, the heat treatment temperature is preferably controlled to a predetermined value relative to a heat deformation temperature, instead of controlling it to a predetermined value relative to a melting point. By performing the heat treatment with a predetermined temperature difference from the heat deformation temperature, the fluidity of the liquid crystal polymer molecules can be precisely controlled thanks to the heat-resistant releasable supports disposed in close contact with the TLCP film. It should be noted that the heat deformation temperature of the TLCP film can be adjusted by performing heat treatment to a film for increasing the heat deformation temperature thereof, and a longer heating time generally makes it possible to increase heat deformation temperature of the film.

The heat treatment time can be suitably set depending on the heating temperature. In order to control the dielectric constant in the thickness direction of the TLCP film while preventing the heat deformation temperature of the TLCP film from increasing, the heat treatment may be performed for from 30 seconds to 30 minutes, preferably from 2 minutes to 25 minutes, and more preferably from 5 minutes to 20 minutes.

After the heat treatment, in view of fixing the arrangement of the flown (moved) liquid crystal polymer molecules, it is preferable to perform quenching the heat-treated laminated material so as to be cooled to a room temperature with keeping the laminated structure in which the heat-resistant releasable supports are disposed in close contact with the opposite surfaces of the TLCP film. Then, the heat-resistant releasable supports can be peeled off to obtain the heat-treated TLCP film alone.

Further, on a film plane of the TLCP film, in order to control the thermal expansion coefficients of the TLCP film both in one direction of the film and in a direction perpendicular to the one direction of the film within the predetermined range, the non-heat-treated TLCP film may be preferably highly isotropic. For example, SOR, which indicates molecular orientation of the TLCP film, may preferably be in a range of from 0.8 to 1.4, and more preferably from 1.0 to 1.3. For example, a TLCP film having a molecular orientation in such a range that can be achieved with reference to WO 2015/050080.

TLCP Film

The thus-obtained TLCP film of the present invention has excellent processability and a dielectric constant in the thickness direction of the TLCP film within a predetermined range, so that it can be suitably used as a substrate material (such as, for example, a high-frequency circuit board material adapted to 1 to 300 GHz) and, in particular, as a substrate used in a radar adapted to a frequency band of from 10 to 300 GHz (preferably from 20 to 300 GHz).

Dielectric Constant

The TLCP film of the present invention may have a dielectric constant ($D_Z$) in the thickness direction (Z direction) of the film in a range of from 2.5 to 3.2, preferably from 2.6 to 3.2, and more preferably from 2.7 to 3.1 at a temperature of 23° C. and a frequency of 20 GHz. By controlling the dielectric constant in the thickness direction, the TLCP film can be suitably used as a circuit board material having a stripline structure and be used to, in particular, a substrate of a millimeter-wave radar. It should be noted that the dielectric constant in the thickness direction is a value measured in accordance with the method described in the Examples below.

The TLCP film of the present invention may have, on the film plane, dielectric constants of from 2.6 to 3.7, preferably from 2.7 to 3.7, more preferably from 2.9 to 3.6, and further preferably from 3.1 to 3.5 at a temperature of 23° C. and a frequency of 15 GHz both in one direction of the film and in a direction perpendicular to the one direction of the film. It should be noted that the dielectric constants in the one direction of the film and in the direction perpendicular to the one direction of the film are values measured in accordance with the method described in the Examples below.

The TLCP film according to the present invention may preferably be substantially isotropic in dielectric constant in the plane direction of the film, and have, on the film plane, a ratio ($D_X/D_Y$) of a dielectric constant ($D_X$) in one direction (X direction) of the film to a dielectric constant ($D_Y$) in a direction (Y direction) perpendicular to the one direction of the film at a temperature of 23° C. and a frequency of 15 GHz within a range of, for example, from 0.73 to 1.37, preferably from 0.81 to 1.24, and more preferably from 0.89 to 1.13.

Considering a balance of the dielectric constants between in the planar directions of the film and in the thickness direction of the film, a difference between the dielectric constant (e.g., an average of $D_X$ and $D_Y$) in the planar directions and the dielectric constant ($D_Z$) in the thickness direction may be, for example, 0.9 or smaller, as expressed by the following formula (1). The difference may preferably be 0.8 or smaller, and more preferably 0.7 or smaller.

$$0 \leq |(D_X + D_Y)/2 - D_Z| \leq 0.9 \quad (1)$$

Further, the dielectric constant (for example, an average of $D_X$ and $D_Y$) in the planar directions of the film may preferably have a relationship represented by the following formula (2), and more preferably have a relationship represented by the following formula (3), relative to the dielectric constant ($D_Z$) in the thickness direction.

$$-0.1 \leq \{(D_X + D_Y)/2 - D_Z\} \leq 0.9 \quad (2)$$

$$-0.1 \leq \{(D_X + D_Y)/2 - D_Z\} \leq 0.6 \quad (3)$$

Thermal Expansion Coefficient

The TLCP film according to the present invention may have, on the film plane, thermal expansion coefficients of, for example, from 13 to 22 ppm/° C., preferably about from 15 to 20 ppm/° C., and more preferably about from 16 to 19 ppm/° C. both in one direction of the film and in a direction perpendicular to the one direction of the film. Since the thermal expansion coefficients of the TLCP film according to the present invention can be adjusted depending on the heat treatment, the TLCP film can have a wide range of thermal expansion coefficients. For example, in the case where the TLCP film is used as a circuit board, the TLCP film may have a thermal expansion coefficient adjusted to that of a material of a counterpart. It should be noted that the thermal expansion coefficients are values measured in accordance with the method described in the Examples below.

Isotropy or anisotropy in thermal expansion coefficient of the TLCP film in the planar directions can be controlled by means of anisotropy and isotropy of the heat-resistant releasable supports to be disposed in close contact with the TLCP film. The TLCP film according to the present invention may preferably have substantially isotropic the thermal expansion coefficients in the plane direction, and may have, on the film plane, a ratio ($\alpha_X/\alpha_Y$) of a thermal expansion coefficient ($\alpha_X$) in one direction (X direction) of the film to a thermal expansion coefficient ($\alpha_Y$) in a direction (Y direction) perpendicular to the one direction of the film within a range of, for example, from 0.6 to 1.7, and preferably from 0.8 to 1.3.

Melting Point

The TLCP film may have a melting point selected in a range of from about 200 to 360° C., preferably from about 240 to 350° C., and more preferably from about 260 to 330° C. in order to achieve desired heat resistance and processability of the film. It should be noted that the melting point is a value measured in accordance with the method described in the Examples below.

Heat Deformation Temperature

The TLCP film according to the present invention may have a heat deformation temperature of from 180 to 320° C., preferably from 200 to 310° C., and more preferably from 220 to 300° C. It should be noted that the heat deformation temperature is a value measured in accordance with the method described in the Examples below. In the present invention, the specific heat treatment makes it possible to control dielectric constant of the film in the thickness direction within a desired range while suppressing increase in heat deformation temperature of the TLCP film even after the heat treatment.

Thickness

Thanks to controlled dielectric constant of the film in the thickness direction even in the film with a small thickness, the TLCP film according to the present invention may have a thickness of, for example, 500 μm or smaller (for example, from 10 to 200 μm), and more preferably from 15 to 150 μm, as a thickness of the TLCP film where a single film is used as an electrical isolation layer of a circuit board. Further, depending on use, TLCP films may be layered to achieve an arbitrary thickness and be shaped in the form of e.g., a plate or sheet having a thickness of 5 mm or smaller. For example, where the film(s) is used for a high-frequency transmission line, a larger thickness the film has, a smaller transmission loss the film achieves so that the film(s) preferably has a thickness as large as possible.

Metal-Clad Laminate

An aspect of the present invention may include a metal-clad laminate comprising the TLCP film and a metal layer (for example, a metal sheet) provided on at least one surface of the TLCP film.

The metal layer may be made of, for example, gold, silver, copper, iron, nickel, aluminum, or a metal alloy thereof. The metal-clad laminate may preferably be a copper-clad laminate.

As long as the dielectric constant in the thickness direction of the TLCP film can be maintained, the metal-clad laminate may be produced by a known or conventional process, such as vapor deposition of a metal layer onto a surface of the TLCP film or formation of a metal layer by electroless plating or electrolytic plating. The metal-clad laminate may also be produced by placing a metal foil (for example, copper foil) on the TLCP film to perform thermal compression-bonding of the foil and the TLCP film by roll-to-roll processing or continuous isotropic pressure pressing (of a double belt type) in a continuous manner.

Circuit Board

Another aspect of the present invention includes a circuit board comprising at least one conductor layer and at least one insulator (or dielectric body) layer. As long as the TLCP film is used as an insulator (or a dielectric body), the circuit board is not particularly limited in terms of its form and can be applied as various high-frequency circuit boards in a known or conventional manner. The circuit board may be a circuit board including a semiconductor element (for example, an IC chip) provided thereon (or a semiconductor element-implemented substrate).

Conductor Layer

The conductor layer is made of, for example, at least a conductive metal, and a circuit pattern is formed on the conductor layer by a known circuit processing method. A conductor constituting the conductor layer may be any of various conductive metals such as gold, silver, copper, iron, nickel, aluminum, or a metal alloy thereof. Further, a circuit pattern may be formed on the part of the metal layer of the metal-clad laminate by a known circuit processing method.

In particular, the circuit board according to an aspect of the present invention has controlled dielectric constants not only in planar directions of the circuit board, but also in a thickness direction of the circuit board. Thus, the circuit board may be used for various transmission lines (for example, known or conventional transmission lines such as coaxial lines, striplines, microstrip lines, coplanar lines, and parallel lines) or antennas (for example, microwave or millimeter-wave antennas). The circuit board may also be used for antenna devices each including an antenna and a transmission line integrated thereto.

Examples of the antennas may include those using millimeter waves or microwaves, such as waveguide slot antennas, horn antennas, lens antennas, printed antennas, triplate antennas, microstrip antennas, patch antennas, and others.

Each of these antennas at least includes, for example, as a base material of the antenna, a circuit board (preferably multilayer circuit board) including at least one conductor layer and at least one insulator (or dielectric body) of the TLCP film according to the present invention.

The circuit board (or semiconductor element-implemented substrate) according to the present invention may be preferably used in various sensors (in particular, vehicular radars). Each of such various sensors (in particular, vehicular radars) may at least include, for example, a circuit board including the TLCP film according to the present invention and a semiconductor element (for example, an IC chip).

EXAMPLES

Hereinafter, the present invention will be described in more detail with reference to the Examples. However, the present invention will not be limited by the Examples whatsoever. In the Examples and Comparative Examples below, various physical properties were determined in the following manner.

Segment Orientation Ratio (SOR)

A liquid crystal polymer film is prepared and is inserted into a microwave resonant waveguide of a microwave molecular orientation analyzer (MOA6015, manufactured by Oji Scientific Instruments Co., Ltd.; E8241A, manufactured by Agilent Technologies, Inc.) such that a film surface is oriented perpendicular to a travelling direction of microwaves to measure an electric field intensity (microwave transmission intensity) of the microwaves transmitted through the film. Then, an m value of a refractive index is calculated on the basis of the measurement value by the following formula.

$$m=(Z_0/\Delta z)\times[1-\nu_{max}/\nu_0]$$

In the formula, $Z_0$ denotes a device constant; $\Delta z$ denotes an average thickness of an object; $\nu_{max}$ denotes a vibration frequency which gives a maximum microwave transmission intensity when vibration frequencies of the microwaves are varied; and $\nu_0$ denotes a vibration frequency which gives a maximum microwave transmission intensity when the average thickness is zero (that is, when there is no object).

Next, a segment orientation ratio, i.e., SOR was calculated as $m_0/m_{90}$, in which $m_0$ denotes an m value when the object had a rotation angle of 0° with respect to a vibration direction of the microwaves, i.e., when the vibration direction of the microwaves coincided with a direction in which molecules of the object are most well-oriented and which gives a minimum microwave transmission intensity; and $m_{90}$ denotes an m value when the rotation angle is 90°.

Film Thickness

A film thickness of a sample was calculated as an average of measurements taken at 9 locations at equal intervals in an area of 6 mm in machine directions and traverse directions from a center point of a sample piece using a contact-type linear gauge (HS3412, manufactured by Ono Sokki Co., Ltd.). The sample piece will be described later for dielectric constant measurement.

Thermal Expansion Coefficient

A thermal expansion coefficient of a film was measured using a thermomechanical analyzer (TMA). The film was subjected to temperature elevation from 25° C. to 200° C. at a rate of 5° C./min, then to cooling to 30° C. at a rate of 20° C./min, and again to temperature elevation at a rate of 5° C./min to measure thermal expansion coefficients between 30° C. and 150° C. It should be noted that the measurements were performed in a machine direction (MD) as one direction (X direction) of the film and in a transverse direction (TD) as a direction (Y direction) perpendicular to the one direction of the film.

Dielectric Constant

Method of Sample Preparation

A sample piece was prepared by cutting a film to a size of 40-mm wide and 50-mm long for measurement of dielectric constants in one direction of the film and a direction perpendicular to the one direction, among planar directions of the film.

Another sample piece was prepared by cutting a film to a size of 50-mm wide and 50-mm long for measurement of a dielectric constant in a thickness direction of the film.

Measurement Method

The dielectric constants in the one direction of the film and the direction perpendicular to the one direction were measured at a temperature of (23±3)° C. The dielectric constants were measured at 15 GHz using a molecular orientation analyzer (MOA6015, manufactured by Oji Scientific Instruments Co., Ltd.). It should be noted that the dielectric constants were measured in an MD as one direction (X direction) of the film and in a TD as a direction (Y direction) perpendicular to the one direction.

The dielectric constant in the thickness direction (Z direction) of the film was measured at a temperature of (23±3)° C. The dielectric constant was measured at 20 GHz using a balanced-type circular disk resonator (manufactured by SUMTFC, Inc.).

As another way of measuring the dielectric constant in the thickness direction (Z direction) of the film, it is also possible to measure the dielectric constant at a temperature of 23° C.±5° C. and a frequency of 15 GHz using a stripline resonator (manufactured by KEYCOM Corporation). In the Examples and Comparative Examples below, the values of the dielectric constants measured using the balanced-type circular disk resonator were employed because values obtained using the balanced-type circular disk resonator and the stripline resonator were substantially the same within a range of ±0.01.

Melting Point

A melting point was determined by observing thermal behavior of a film using a differential scanning calorimeter. That is, a melting point of a TLCP film was determined by subjecting the film to temperature elevation at a rate of 10° C./min to completely melt the film, then to rapid cooling to 50° C. at a rate of 10° C./min, and again to temperature elevation at a rate of 10° C./min to determine the position of an endothermic peak that occurred during the second temperature elevation as the melting point of the film.

Heat Deformation Temperature

A heat deformation temperature was determined by observing thermal behavior of a film using a thermomechanical analyzer. That is, a film was prepared to obtain a test piece having a size of 5-mm wide and 20-mm long. A thermal expansion amount of the test piece in a lengthwise direction was measured under the following condition: a distance between chucks of 15 mm, a tensile load of 0.01 N, and a temperature elevation rate of 10° C./min. An inflection point on a measurement curve was determined as the heat deformation temperature (IT) of the TLCP film.

Example 1

A copolymer of p-hydroxybenzoic acid and 6-hydroxy-2-naphthoic acid (mole ratio: 73/27; polymer A) was melt-extruded to obtain a TLCP film having a melting point of 280° C., a heat deformation temperature of 240° C., a film thickness of 100 μm, and an SOR of 1.1 by inflation molding.

A 100-μm thick polyimide film (thermal expansion coefficient: 16 ppm/° C. in an MD, 16 ppm/° C. in a TD) was prepared as heat-resistant releasable supports. Two sheets of the polyimide film were disposed on opposite surfaces of the obtained TLCP film such that the MDs and the TDs of the respective sheets were aligned with those of the TLCP film, to form a stacked material. The stacked material was preheated using a vacuum hot press machine to obtain a laminated material, and then the laminated material was subjected to heat treatment for 15 minutes at 290° C. (HT+50° C.) under a pressure of 3 MPa to obtain a laminated body. After the heat treatment, thus-obtained laminate body was cooled and taken out from the press machine, and each of the polyimide films was peeled off to obtain a heat-treated TLCP film. Table 7 shows physical properties of the heat-treated TLCP film.

Example 2

A copolymer of p-hydroxybenzoic acid and 6-hydroxy-2-naphthoic acid (mole ratio: 80/20; polymer B) was melt-extruded to obtain a TLCP film having a melting point of 325° C., a heat deformation temperature of 280° C., a film thickness of 100 μm, and an SOR of 1.1 by inflation molding.

Except that the heat treatment using the vacuum hot press machine was performed at 320° C. (HT+40° C.), a heat-treated TLCP film was obtained in the same manner as that of Example 1. Table 7 shows physical properties of the heat-treated TLCP film.

Example 3

A copolymer of p-hydroxybenzoic acid and 6-hydroxy-2-naphthoic acid (mole ratio: 73/27; polymer A) was melt-extruded to obtain a TLCP film having a melting point of 310° C., a heat deformation temperature of 270° C., a film thickness of 100 μm, and an SOR of 1.1 by inflation molding and melting-point raising treatment.

A 100-μm thick polyimide film (thermal expansion coefficient: 27 ppm/° C. in an MD, 16 ppm/° C. in a TD) was prepared as heat-resistant releasable supports. Two pieces of the polyimide film were disposed on opposite surfaces of the obtained TLCP film such that the MDs and the TDs of the respective pieces were aligned with those of the TLCP film, to form a stacked material. The stacked material was pre-heated using a vacuum hot press machine to obtain a laminated material, and then the laminated material was subjected to heat treatment for 15 minutes at 320° C. (HIT+50° C.) under a pressure of 3 MPa to obtain a laminate body. After the heat treatment, thus-obtained laminate body was cooled and taken out from the press machine, and each of the polyimide films was peeled off to obtain a heat-treated TLCP film. Table 7 shows physical properties of the heat-treated TLCP film.

Comparative Example 1

Except that a 50-μm thick aluminum foil (thermal expansion coefficient: 23 ppm/° C.) was prepared as a support to form a one-sided laminated material and that the laminated material was subjected to heat treatment using a hot-air circulating heating furnace having a furnace length of 1.5 m at a controlled temperature of 250° C. (HT+10° C.) and at a speed of 3 m/min, a heat-treated TLCP film was obtained in the same manner as that of Example 1. Table 7 shows physical properties of the heat-treated TLCP film.

Comparative Example 2

Except that the heat treatment using the vacuum press machine in the heat treatment step was performed at 350° C. (HT+70° C.), a heat-treated film was obtained in the same manner as that of Example 2. Table 7 shows physical properties of the heat-treated TLCP film.

Comparative Example 3

A copolymer of p-hydroxybenzoic acid and 6-hydroxy-2-naphthoic acid (mole ratio: 73/27) was melt-extruded to obtain a film having a melting point of 330° C., a heat deformation temperature of 320° C., a film thickness of 100 μm, and an SOR of 1.1 by inflation molding and melting-point raising treatment, as a film having a high melting point and reduced melt fluidity.

Except that the heat treatment using the vacuum press machine in the heat treatment step was performed at 290° C. (HT−30° C.) and for a heat treatment time of 120 minutes, a heat-treated film was prepared in the same manner as that of Example 1. Table 7 shows physical properties of the heat-treated TLCP film.

TABLE 7

| | | Non-heat-treated TLCP film | | | Heat-treated TLCP film | | | | | | | | |
|---|---|---|---|---|---|---|---|---|---|---|---|---|---|
| | | Melting point [° C.] | Heat deformation temperature [° C.] | SOR | Heat treatment step | | | | Dielectric constant | | | Thermal expansion coefficient [ppm/° C.] | | Heat deformation temperature [° C.] |
| | Polymer | | | | Support | Temp. [° C.] | Pressure [MPa] | Time | Z | X | Y | X | Y | |
| Ex. 1 | A | 280 | 240 | 1.1 | PI film 1 | 290 | 3 | 15 min. | 2.9 | 3.3 | 3.3 | 18 | 18 | 240 |
| Ex. 2 | B | 325 | 280 | 1.1 | PI film 1 | 320 | 3 | 15 min. | 2.9 | 3.3 | 3.3 | 18 | 18 | 280 |
| Ex. 3 | A | 310 | 270 | 1.1 | PI film 2 | 320 | 3 | 15 min. | 2.8 | 3.2 | 3.4 | 20 | 17 | 270 |
| Com. Ex. 1 | A | 280 | 240 | 1.1 | Al foil | 250 | — | 30 sec. | 2.4 | 3.4 | 3.4 | −5 | −5 | 240 |
| Com. Ex. 2 | B | 325 | 280 | 1.1 | PI film 1 | 350 | 3 | 15 min. | 3.3 | 3.2 | 3.2 | 80 | 80 | 280 |
| Com. Ex. 3 | A | 330 | 320 | 1.1 | PI film 1 | 290 | 3 | 120 min. | 2.9 | 3.3 | 3.3 | 16 | 16 | 330 |

Polymer A: a copolymer of p-hydroxybenzoic acid and 6 hydroxy-2-naphthoic acid (mole ratio: 73/27)
Polymer B: a copolymer of p-hydroxybenzoic acid and 6-hydroxy-2-naphthoic acid (mole ratio: 80/20)
PI film 1: a polyimide film (thermal expansion coefficient: 16 ppm/° C. in an MD, 16 ppm/° C. in a TD)
PI film 2: a polyimide film (thermal expansion coefficient: 27 ppm/° C. in an MD, 16 ppm/° C. in a TD)
Al foil: an aluminum foil (thermal expansion coefficient: 23 ppm/° C. in an MD, 23 ppm/° C. in a TD)

As shown in Table 7, in Example 1, where the pre-heat-treated TLCP film was retained with the heat-resistant releasable supports provided on the opposite surfaces thereof and was subjected to heating and pressurization using the vacuum hot press machine at a temperature at which TLCP molecules did not flow or move excessively, it was possible to control the dielectric constant of the heat-treated film in the Z direction within the predetermined range while preventing the TLCP film from increasing in heat deformation temperature. In addition, the values of the dielectric constants in the X direction and the Y direction were the same and both fell within the preferable range. Further, the values of the thermal expansion coefficients in the X direction and the Y direction were also the same and both fell within the preferable range.

Example 2 comprising the TLCP film with a higher heat deformation temperature than that of Example 1 was also possible to control the dielectric constant in the Z direction within the predetermined range, thanks to the appropriate heat treatment. In addition, the values of the dielectric constants in the X direction and the Y direction were the same and both fell within the preferable range. Further, the values of the thermal expansion coefficients in the X direction and the Y direction were also the same and both fell within the preferable range.

Example 3 comprising the TLCP film with a higher heat deformation temperature than that of Example 1 was also possible to control the dielectric constant in the Z direction within the predetermined range, thanks to the appropriate heat treatment. In addition, although the TLCP film had different dielectric constants and thermal expansion coefficients between in the X direction and in the Y direction because the heat-resistant releasable supports had different thermal expansion coefficients between in the X direction and in the Y direction, the values of the dielectric constants and the thermal expansion coefficients of the TLCP film both fell within the preferable ranges.

In contrast, in Comparative Example 1, it was not possible to control the dielectric constant in the Z direction within the predetermined range by the processing of the one-sided stacked material using the heating rolls. The values of the dielectric constants in the X direction and the Y direction were the same. In addition, although the values of the thermal expansion coefficients in the X direction and the Y direction were also the same, the values did not fall within the preferable range.

In Comparative Example 2, where the heat treatment temperature was too high relative to the heat deformation temperature, although the dielectric constants in the X direction and the Y direction fell within the preferable range, the dielectric constant in the Z direction was too high. In addition, although the values of the thermal expansion coefficients in the X direction and the Y direction were the same, they did not fall within the preferable range.

Further, in Comparative Example 3 comprising the film with low melt fluidity, it was possible to control the dielectric constants of the heat-treated TLCP film in the Z direction, the X direction, and the Y direction within the preferable ranges, thanks to the long heat treatment time of 120 minutes. Due to the long heat treatment time, however, the heat deformation temperature was increased, resulting in poor processibility of the film.

INDUSTRIAL APPLICABILITY

The TLCP films according to the present invention are applicable as circuit board materials (such as a high-frequency circuit board material and, in particular, a substrate material of a high-frequency circuit used for a microwave or millimeter-wave antenna). Further, the TLCP film of the present invention are advantageously applicable as a substrate material for a vehicular radar using microwaves or millimeter waves.

Although the preferred embodiments of the present invention have been described, various additions, modifications, or deletions may be made without departing from the scope of the invention. Accordingly, such variants are included within the scope of the present invention.

What is claimed is:

1. A thermoplastic liquid crystal polymer film (or TLCP film) comprising a thermoplastic polymer capable of forming an optically anisotropic melt phase, wherein the TLCP film has a dielectric constant of from 2.5 to 3.2 in a thickness direction of the film at a temperature of 23° C. and a frequency of 20 GHz, and a heat deformation temperature of from 180 to 320° C., wherein the thickness direction of the film is perpendicular to planar directions of the film which are along a film plane of the film; wherein the TLCP film has dielectric constants in a relationship represented by the following formula (1):

$$0 \leq |(Dx+Dy)/2 - Dz| \leq 0.9 \quad (1)$$

wherein Dx denotes a dielectric constant in, among planar directions of the film, one direction of the film on a film plane, Dy denotes a dielectric constant in a direction perpendicular to the one direction of the film on the film plane, Dx and Dy being measured at a temperature of 23° C. and a frequency of 15 GHz, and Dz denotes a dielectric constant in the thickness direction of the film measured at a temperature of 23° C. and a frequency of 20 GHz.

2. The TLCP film according to claim 1, wherein the TLCP film has, on a film plane, thermal expansion coefficients of from 13 to 22 ppm/° C. both in one direction of the film and in a direction perpendicular to the one direction of the film.

3. The TLCP film according to claim 1, wherein the TLCP film has, on a film plane, dielectric constants of from 2.6 to 3.7 at a temperature of 23° C. and a frequency of 15 GHz both in one direction of the film and in a direction perpendicular to the one direction of the film.

4. The TLCP film according to claim 1, wherein a ratio (Dx/Dy) falls within a range of from 0.73 to 1.37.

5. The TLCP film according to claim 1, wherein a ratio (αx/αy) of a thermal expansion coefficient (αx) in one direction of the film to a thermal expansion coefficient (αy) in a direction perpendicular to the one direction of the film on a film plane falls within a range of from 0.6 to 1.7.

6. The TLCP film according to claim 1, wherein the TLCP film is used as a substrate material in a radar adapted to a frequency band of from 1 to 300 GHz.

7. A metal-clad laminate comprising the TLCP film as recited in claim 1 and a metal layer provided on at least one surface of the TLCP film.

8. A circuit board comprising at least one conductor layer and the TLCP film as recited in claim 1.

9. The circuit board according to claim 8, wherein the circuit board is a multilayer circuit board.

10. The circuit board according to claim 8, comprising a semiconductor element.

11. A vehicular radar comprising the circuit board as recited in claim 8.

12. The TLCP film according to claim 1, wherein the heat deformation temperature of the TLCP film is from 270 to 320° C.

13. The TLCP film according to claim 1, wherein the TLCP film has gone through a heat treatment that is configured to control the dielectric constant in the thickness direction of the film and prevent a heat deformation temperature of the TLCP film from increasing.

14. The TLCP film according to claim 1, wherein the TLCP film has gone through a heat treatment from (HT+10) ° C. to (HT+60) ° C. at a pressure of 1 MPa to 6 MPa for 30 seconds to 30 minutes, and HT is a heat deformation temperature of the TLCP film before the heat treatment.

15. The TLCP film according to claim 1, wherein:
the planar directions of the film include a first planar direction and a second planar direction, and
the first planar direction and the second planar direction are parallel to the film plane of the film, perpendicular to each other, and perpendicular to the thickness direction of the film.

16. The TLCP film according to claim 1, wherein:
the planar directions of the film include a length direction and a width direction, and
the length direction and the width direction are parallel to the film plane of the film, perpendicular to each other, and perpendicular to the thickness direction of the film.

\* \* \* \* \*